(12) United States Patent
Ohno et al.

(10) Patent No.: US 9,185,817 B2
(45) Date of Patent: Nov. 10, 2015

(54) DISPLAY PANEL

(75) Inventors: Takashi Ohno, Kanagawa (JP);
Takahiro Imayoshi, Miyazaki (JP);
Masakuni Kawagoe, Miyazaki (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 127 days.

(21) Appl. No.: 13/064,084

(22) Filed: Mar. 4, 2011

(65) Prior Publication Data

US 2011/0216490 A1    Sep. 8, 2011

(30) Foreign Application Priority Data

Mar. 5, 2010   (JP) .................................. 2010-049657

(51) Int. Cl.
*H05K 7/00* (2006.01)
*G02F 1/1345* (2006.01)
*H05K 3/36* (2006.01)

(52) U.S. Cl.
CPC ................ *H05K 7/00* (2013.01); *G02F 1/1345* (2013.01); *G02F 1/13452* (2013.01); *H05K 3/361* (2013.01)

(58) Field of Classification Search
CPC ............. H05K 7/02; H05K 7/06; H05K 7/08; H05K 7/10
USPC ........... 361/679.01, 679.21–679.23, 728–783
See application file for complete search history.

(56) References Cited

U.S. PATENT DOCUMENTS

| | | | |
|---|---|---|---|
| 6,407,796 B2 * | 6/2002 | Tajima et al. | 349/150 |
| 6,542,213 B1 * | 4/2003 | Uchiyama | 349/149 |
| 6,664,942 B1 * | 12/2003 | Kim et al. | 345/92 |
| 6,686,987 B1 * | 2/2004 | Sakaki et al. | 349/149 |
| 6,864,941 B2 * | 3/2005 | Yano | 349/149 |
| 7,034,813 B2 * | 4/2006 | Ishiyama | 345/205 |
| 7,102,631 B2 * | 9/2006 | Kim et al. | 345/204 |
| 7,283,130 B2 * | 10/2007 | Takenaka et al. | 345/206 |
| 7,477,351 B2 * | 1/2009 | Kim et al. | 349/149 |
| 7,599,193 B2 * | 10/2009 | Park et al. | 361/783 |
| 2009/0009477 A1 * | 1/2009 | Yukawa et al. | 345/168 |
| 2009/0065269 A1 * | 3/2009 | Katsurahira | 178/19.06 |
| 2009/0231823 A1 * | 9/2009 | Kunimatsu et al. | 361/783 |

FOREIGN PATENT DOCUMENTS

| | | |
|---|---|---|
| JP | 10-214858 A | 8/1998 |
| JP | 2008-077092 A | 4/2008 |
| WO | WO 2010-143489 A1 | 12/2010 |

OTHER PUBLICATIONS

Japanese Office Action dated Sep. 30, 2014.

* cited by examiner

*Primary Examiner* — Zachary M Pape
*Assistant Examiner* — Douglas Burtner
(74) *Attorney, Agent, or Firm* — Rabin & Berdo, P.C.

(57) ABSTRACT

The present invention provides a display panel including: a first input terminal group in which input terminals are disposed at intervals along first long side of a rectangular driver IC facing a panel end portion; a second input terminal group in which input terminals are disposed at intervals along the second long side of the driver IC facing a display section; a first wiring group connected to the first input terminal group, that extends under the first short side of the driver IC and extends out from between the driver IC and the panel body; and a second wiring group connected to the second input terminal group, that passes under the second long side of the driver IC and extends out from between the driver IC and the panel body.

20 Claims, 6 Drawing Sheets

DISPLAY PANEL

CROSS-REFERENCE TO RELATED APPLICATION

This application claims priority under 35 USC 119 from Japanese Patent Application No. 2010-049657, filed on Mar. 5, 2010, the disclosure of which is incorporated by reference herein.

BACKGROUND OF THE INVENTION

1. Field of the Invention

The present invention relates to a display panel.

2. Description of the Related Art

A conventional display panel that has narrowed frame by not providing groups of wirings including transparent electrodes provided between a panel end portion of a panel body and a driver IC for driving a display unit, so as to reduce an interval defined between the panel end portion and the driver IC, has been known.

Input terminals of the driver IC are normally disposed along a first short side of the driver IC. However, when the number of input terminals is large, and the input terminals cannot be disposed along the first short side, the input terminals may be disposed along the first long side of the driver IC.

In such case, when the above method for aligning the input terminals is adopted, the number of input terminals which can be disposed along the first short side of the driver IC depends upon an interval defined between the input terminals. Therefore, the area of the driver IC becomes greater to an increase in number of input terminals.

On the other hand, Japanese Patent Application Laid-open (JP-A) No. 10-214858 discloses the configuration in which plural input terminals of a semiconductor chip are disposed along first long side of the semiconductor chip, and along the second long side of the semiconductor chip.

However, in the configuration disclosed in JP-A No. 10-214858, wirings are drawn from both of the long sides of the semiconductor chip outward of the driver IC. Therefore, the above configuration cannot be applied to a display panel that has no wiring interposed between a panel end portion and the driver IC.

SUMMARY OF THE INVENTION

The present invention provides a display panel that may suppress increase in area of a driver IC due to increased numbers of input terminals.

A first aspect of the invention is a display panel including: a panel body including a display section; a rectangular driver IC, provided between the display section and a panel end portion of the panel body and disposed with the display section in a longitudinal direction, which drives the display section; a first input terminal group in which input terminals are disposed at intervals along a first long side of the rectangular driver IC that faces the panel end portion; a second input terminal group in which input terminals are disposed at intervals along a second long side of the rectangular driver IC that faces the display section; a first wiring group that is connected to the first input terminal group, that is formed on the panel body between the rectangular driver IC and the panel body, that passes under a first short side of the rectangular driver IC and that extends out from between the rectangular driver IC and the panel body; and a second wiring group that is connected to the second input terminal group, that is formed on the panel body between the rectangular driver IC and the panel body, that passes under the second long side of the rectangular driver IC and that extends out from between the rectangular driver IC and the panel body.

According to the first aspect of the present invention, the first wiring group, that has reduced intervals between the wirings or the smaller width of the wiring than the first input terminal group, is disposed along the first short side in the driver IC. Due thereto, in the first aspect of the present invention, the input terminals of the first input terminal group, that are to be respectively connected to the first wiring group, is disposed, according to the number of the wires of the first wiring group that may be disposed (wired) along the first long side in the driver IC.

Therefore, according to the first aspect of the present invention, the number of input terminals that can be disposed may increase, since the input terminals are disposed along the first long side in the driver IC, when compared with, for example, a case where the first input terminal group is disposed along the first short side in the driver IC. Moreover, the first aspect of the present invention may suppress the increase in area of the driver IC due to increased number of input terminals.

In the display panel according to the first aspect, each of the wirings is not drawn from the first long side in the driver IC to the panel body. Accordingly, the present invention may be particularly effective in a so-called "narrowed edge panel" in which a frame is narrowed by aligning no wire between a panel end portion and the driver IC.

Note that, the term "narrowed edge panel" refers to a panel provided with configuration where no inputting wiring is formed between the driver IC and the panel end portion.

A second aspect of the invention, in the above first aspect, the first input terminal group and the second input terminal group may be sequentially disposed from an end portion of the first short side of the rectangular driver IC; and wirings of the first wiring group that are connected to the input terminals of the first input terminal group and that are disposed further toward a second short side of the rectangular driver IC than the second input terminal group, may extend out from under the second long side of the rectangular driver IC.

According to the above aspect, even when the number of the terminals in the first input terminal group is increased, and some of the wirings in the first wiring group may not extend out from the first short side of the driver IC, some of the wirings in the first wiring group may extend out from the second long side in the driver IC.

A third aspect of the invention, in the above aspects, a width of wirings of the first wiring group that extend out from under the first short side of the rectangular driver IC may be smaller than a width of the input terminals of the first input terminal group and the second input terminal group.

According to the above aspect, when compared with, for example, a case where the first input terminal group is disposed along the first short side of the driver IC, the number of input terminals that can be disposed may be increased, since the width of the wiring in the first wiring group is smaller than width of each terminal. Accordingly, the above aspect of the present invention may suppress the increase in area of the driver IC due to increased number of input terminals.

A fourth aspect of the invention, in the above aspects, intervals between wirings of the first wiring group and intervals between wirings of the second wiring group may be smaller than the intervals between the input terminals of the first input terminal group and the intervals between the input terminals of the second input terminal group.

According to the above aspect, when compared with, for example, a case where the first input terminal group is disposed along the first short side of the driver IC, the number of input terminals that can be disposed may be increased, since the interval between the wirings in the first wiring group is smaller than the interval between the terminals in the first input terminal group. Accordingly, the above aspect of the present invention may suppress the increase in area of the driver IC due to increased number of input terminals.

A fifth aspect of the present invention, in the above aspects, a number of input terminals disposed along both of the long sides of the rectangular driver IC may be larger than a number of input terminals that can be disposed at either short side of the rectangular driver IC.

According to the above aspect, when compared with, for example, a case where the first input terminal group is disposed along the first short side of the driver IC, the increase in area of the driver IC due to increased number of input terminals may be suppressed.

A sixth aspect of the present invention, in the above aspects, the first wiring group may extend from the first input terminal group toward the second input terminal group, then may extend toward the first short side of the rectangular driver IC before reaching the second input terminal group, and may extend under the first short side of the rectangular driver IC; and the second wiring group may extend from the second input terminal group toward the second long side of the rectangular driver IC, and may extend under the second long side of the rectangular driver IC.

According to the above aspect, the first wiring group may be wired in the panel body between the first input terminal group and the second input terminal group of the driver IC.

A seventh aspect of the present invention, in the above aspects, the rectangular driver may IC include a CPU interface and a driving circuit; and the first input terminal group and the second input terminal group may be groups of input terminals for the CPU interface and the power source circuit.

According to the above aspect, the first input terminal group and the second input terminal group may work as groups of input terminals for the CPU interface and the power source circuit.

An eighth aspect of the present invention, in the above aspects, the wirings of the first wiring group and the second wiring group may be transparent electrodes.

According to the above aspect, the first wiring group and the second wiring group may be transparent electrodes.

According to the above aspects, the present invention provides a display panel that may suppress increase in area of a driver IC due to increased numbers of input terminals.

BRIEF DESCRIPTION OF THE DRAWINGS

Exemplary embodiments of the present invention will be described in detail based on the following figures, wherein.

DETAILED DESCRIPTION OF THE INVENTION

Figure 1:
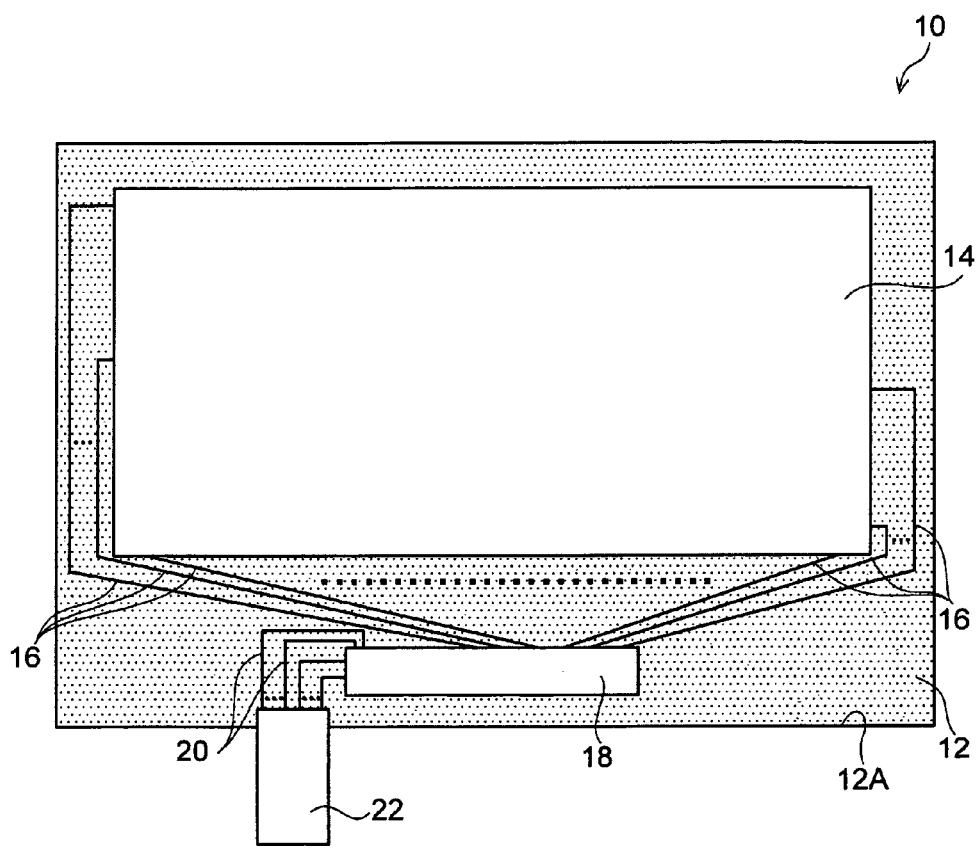
FIG. 1 is a view illustrating the schematic configuration of a display panel according to an exemplary embodiment of the invention.

Hereinbelow, a description will be given of a display panel according to an exemplary embodiment of the present invention with reference to the attached drawings. Note that constituent elements having substantially the same functions will be designated by the same reference numerals throughout the drawings, and their explanations may be omitted.

FIG. 1 is a view showing the schematic configuration of a display panel according to an exemplary embodiment of the invention.

A display panel 10 of the exemplary embodiment according to the present invention includes a panel body 12 formed into a rectangular shape when viewed from the front. At substantially the center of the panel body 12, a rectangular display section 14 is disposed so that a longitudinal direction of the rectangular display section 14 matches with a longitudinal direction of the panel body 12.

One end of each transparent electrode 16, wired to the panel body 12, is connected to the display section 14. To the other end of each transparent electrode 16, a driver IC 18 is connected.

The driver IC 18 is disposed between the display section 14 and a panel end portion 12A of the panel body 12 (i.e., the outer peripheral portion of the panel body 12) so that the driver IC 18 extends along the display section 14 in the longitudinal direction. Namely, the driver IC 18 is disposed so that the longitudinal direction of the driver IC 18 matches with the longitudinal direction of the display section 14. The driver IC 18 outputs a drive signal or the like, to the display section 14 through the plural transparent electrodes 16. Signal is input to the driver IC 18 via plural transparent electrodes 20, that are connected to one end of the driver IC 18, and are connected to the panel body 12.

The other end of each of the plural transparent electrodes 20 is collected within a flexible board 22, to be drawn outward of the panel body 12, and is connected to a CPU (not shown), a voltage source device, or the like.

Note that, in order to achieve a narrowed edge, a space defined between the panel end portion 12A and the driver IC 18 is made minimum by not wiring any transparent electrodes 20 therebetween. On the other hand, spaces for wiring the transparent electrodes 20 are defined in the panel body 12 between the driver IC 18 and the display section 14 or in the panel body 12 in the longitudinal direction of the driver IC 18. Note that the term "narrowed edge panel" refers to a panel that has a configuration in which inputting transparent electrodes 20 (wirings) are not disposed between the driver IC 18 and the panel end portion 12A, in order to reduce the area of the panel body 12. In general, a signal is input into the driver IC 18 from the outside of the display panel 10 via the transparent electrodes 20. In this case, the flexible board 22, for example, is overlapped on the side of the panel 12, and the driver IC 18 is electrically connected to the transparent electrodes 20. Accordingly, when the transparent electrodes 20 are drawn between the driver IC 18 and the panel end portion 12A, it is necessary to secure the space for the overlap between the driver IC 18 and the panel end portion 12A, which may result in increase of area of the panel body. Therefore, in the conventional display panel, the increase in area of the panel body 12 has been suppressed by interposing no transparent electrode 20 between the driver IC 18 and the panel end portion 12A.

Note that, since the length of the display section 14 in the longitudinal direction is generally longer than the longitudinal direction of the driver IC 18, the transparent electrodes 20 are drawn in a horizontal space of the driver IC 18.

Next, the driver IC 18 of an exemplary embodiment of the present invention is described in detail.

Figure 2:
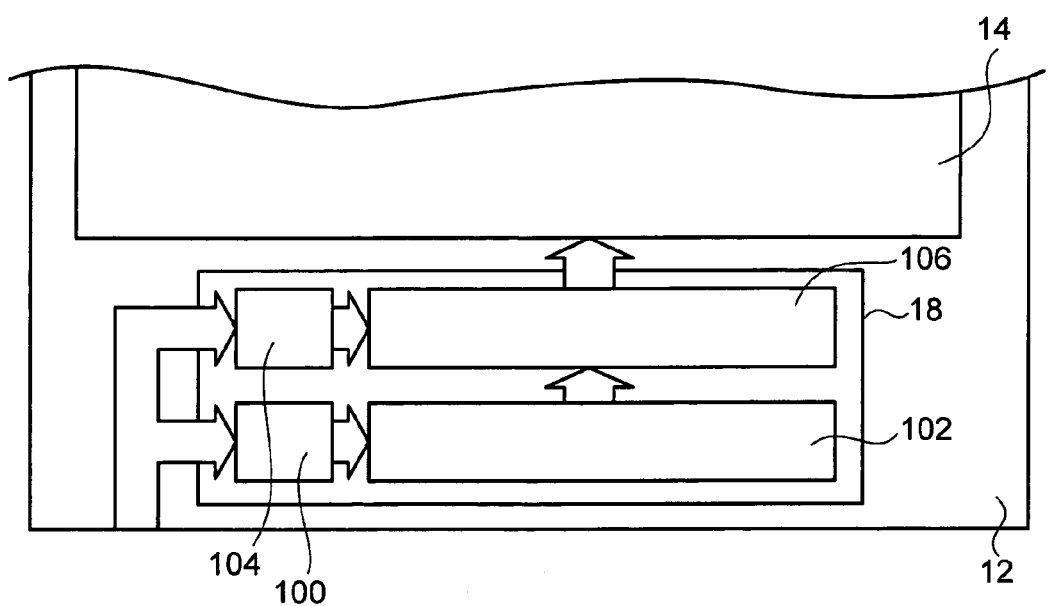
FIG. 2 is a functional block diagram illustrating the schematic configuration of a driver IC disposed on the display panel shown in FIG. 1.

FIG. 2 is a functional block diagram illustrating the schematic configuration of the driver IC 18.

The driver IC 18 includes a CPU interface 100, a control circuit 102, a power source circuit 104, and a driving circuit 106.

The CPU interface 100 receives an input signal from the CPU (not shown), via the transparent electrodes 20 (i.e., signal wirings), and transmits data based on the input signal to the control circuit 102.

The control circuit 102 produces display data based on the data received from the CPU interface 100, and transmits the display data to the driving circuit 106.

On the other hand, the power source circuit 104 receives a voltage from the voltage source device (not shown), via the plural transparent electrodes 20 (i.e., power source wirings), generates a voltage required for the driving circuit 106, and supplies the required voltage to the driving circuit 106.

The driving circuit 106 outputs the voltage generated in the power source circuit 104 and an output signal, in accordance with the display data, to the display section 14 in a desired drive waveform, via the plural transparent electrodes 16.

Figure 3:
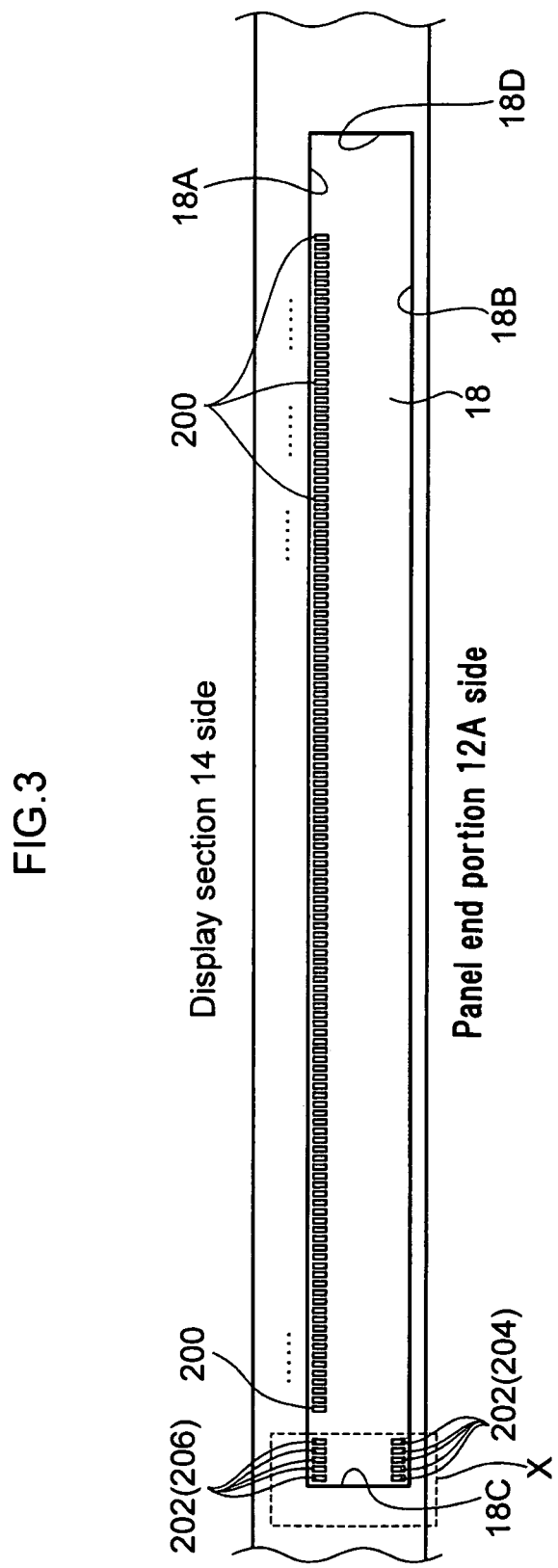
FIG. 3 is a view illustrating the arrangement of input terminals and output terminals in the driver IC illustrated in FIG. 2.

FIG. 3 is a view showing the arrangement of input terminals and output terminals in the driver IC 18. Note that the wirings connected to each of the terminals are omitted in FIG. 3.

Output terminals 200 are the output terminals for the driving circuit 106 in the driver IC 18, that outputs the signal in the above desired drive waveform. In order to provide a narrowed edge, the plural output terminals 200 are disposed along a long side 18A facing the display section 14 in the driver IC 18. The other ends of the above plural transparent electrodes 16 are connected to the output terminals 200, respectively.

In contrast, input terminals 202 are the input terminals for the CPU interface 100 and the power source circuit 104 in the driver IC 18, that receives the signals from the CPU (not shown) or the voltage from the voltage source device (not shown). The plural input terminals 202 are disposed at intervals along the first long side 18B of the driver IC 18 that faces the panel end portion 12A, and are disposed at intervals along the second long side 18A of the driver IC 18 that faces the display section 14.

Hereinafter, the plural input terminals 202 disposed with intervals along the first long side 18B of the driver IC 18 that faces the panel end portion 12A are referred to as a first input terminal group 204. Further, the plural input terminals 202 disposed at intervals along the second long side 18A of the driver IC 18 that faces the display section 14 are referred to as a second input terminal group 206.

In order to suppress an increase in area of the driver IC 18, it is preferred to sequentially dispose the first input terminal group 204 and the second input terminal group 206 from the first short side 18C (a left short side in FIG. 3) of the driver IC 18, and is preferred not form a group of input terminals or the like on the second short side 18D (a right short side in FIG. 3) of the driver IC 18. However, a dummy terminal may be disposed on the second short side 18D of the driver IC 18 to enhance adhesion strength. Further, counterparts of the input terminal group formed on the first short side 18C of the driver IC 18 may be formed on the second short side 18D of the driver IC 18.

Figure 4:
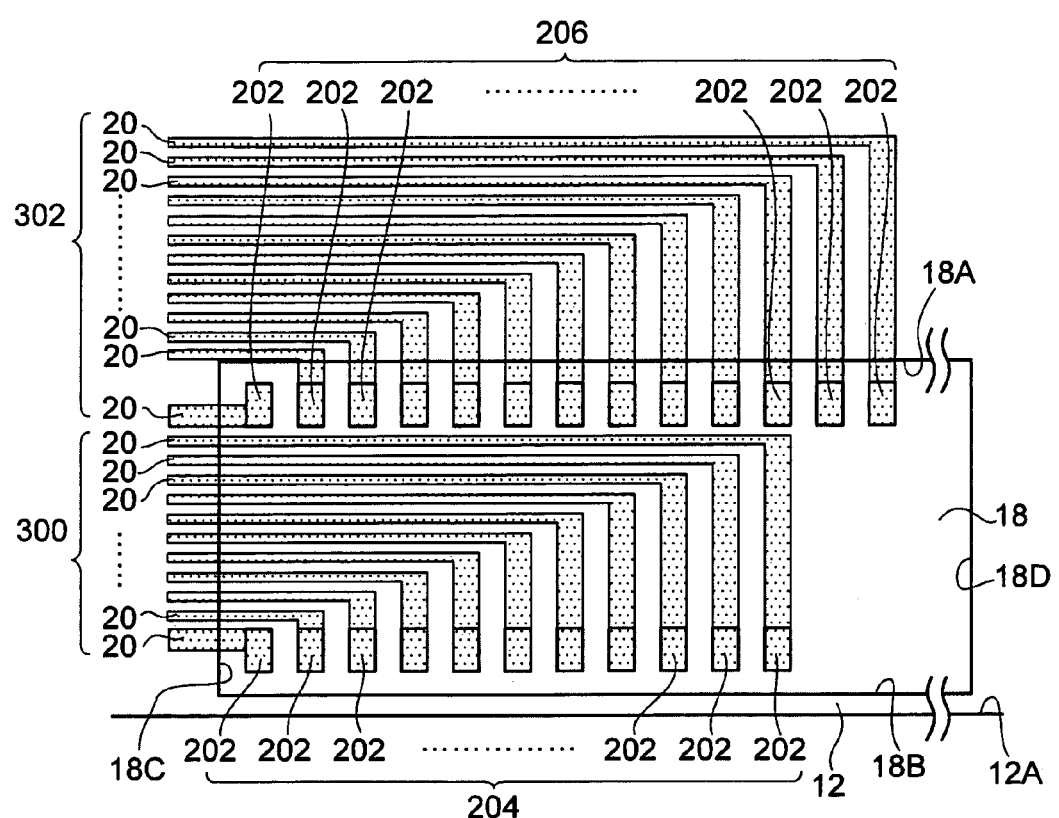
FIG. 4 is a partially enlarged view of the driver IC enclosed by a dot line X of FIG. 3.

FIG. 4 is a partially enlarged view of the driver IC 18 enclosed by a dot line X of FIG. 3.

The plural transparent electrodes 20 are connected to the first input terminal group 204. Note that, hereinafter, the transparent electrodes 20 connected to the first input terminal group 204 are referred to as a first wiring group 300.

The first wiring group 300 is formed on the panel body 12 between the driver IC 18 and the panel body 12. Further, the first wiring group 300 extends from the first input terminal group 204 toward the second input terminal group 206, then extends toward the first short side 18C of the driver IC 18 on the way toward the second input terminal group 206, and then extends out from between the driver IC 18 and the panel body 12 through under the first short side 18C of the driver IC 18. In this case, a wiring that extends from the input terminal 202 formed right side of a certain input terminal 202 (i.e., on the second short side 18D side) circumvents a wiring drawn from the input terminal 202 formed left side (i.e., on the first short side 18C side of the driver IC 18), and extends leftward above the wiring drawn from the input terminal 202 formed on the left (i.e., on the second long side 18A side of the driver IC 18).

Note that some of the wirings (i.e., a wiring arranged lowermost in FIG. 4) in the first wiring group 300 extends immediately toward the first short side 18 of the driver IC 18 without extending from the first input terminal group 204 toward the second input terminal group 206, and extends out from under the short side 18C.

Further, the width of the wiring in the first wiring group 300 that extends under the first short side 18C of the driver IC 18 is formed smaller than width of the terminals in the first input terminal group 204 and the second input terminal group 206.

Furthermore, the intervals between the wirings that extend from under the first short side 18C of the driver IC 18 in the first wiring group 300 is formed smaller than the intervals between the terminals of the first input terminal group 204.

On the other hand, rests of the above plural transparent electrodes 20 are connected to the second input terminal group 206. Note that, hereinafter, the transparent electrodes 20 connected to the second input terminal group 206 are referred to as a second wiring group 302.

The second wiring group 302 is formed on the panel body 12 between the driver IC 18 and the panel body 12. Further, the second wiring group 302 extends from the second input terminal group 206 toward the second long side 18A of the driver IC 18, and then extends from between the driver IC 18 and the panel body 12 through under the second long side 18A of the driver IC 18. Note that, some of wiring in the second wiring group 302 (i.e., a wiring arranged lowermost in the second wiring group 302 in FIG. 4) does not extend from the second long side 18A to the panel body 12, but extends from under the first short side 18C of the driver IC 18, as the first wiring group 300.

The interval between the wirings of the second wiring group 302 is made smaller than the intervals between the terminals of the second input terminal group 206.

When connecting the first wiring group 300 to the first input terminal group 204, while designing the display panel 10, the input terminal 202 nearest to the first short side 18C of the first input terminal group 204 is first connected. At this time, the number of wirings to be connected to the input terminals 202 is the number of wirings that can pass between the first input terminal group 204 and the second input terminal group 206, or less. Note that, in FIG. 4, maximum number of wirings that can pass between the first input terminal group 204 and the second input terminal group 206 are wired. Further, when connecting the second wiring group 302 to the second input terminal group 206, it is wired from between the first input terminal group 204 and the second input terminal group 206 if there still remains a space capable of allowing the wiring to pass therebetween. However, if there remains no space, it is wired from the second input terminal group 206 toward the second long side 18A of the driver IC 18.

Figure 6:
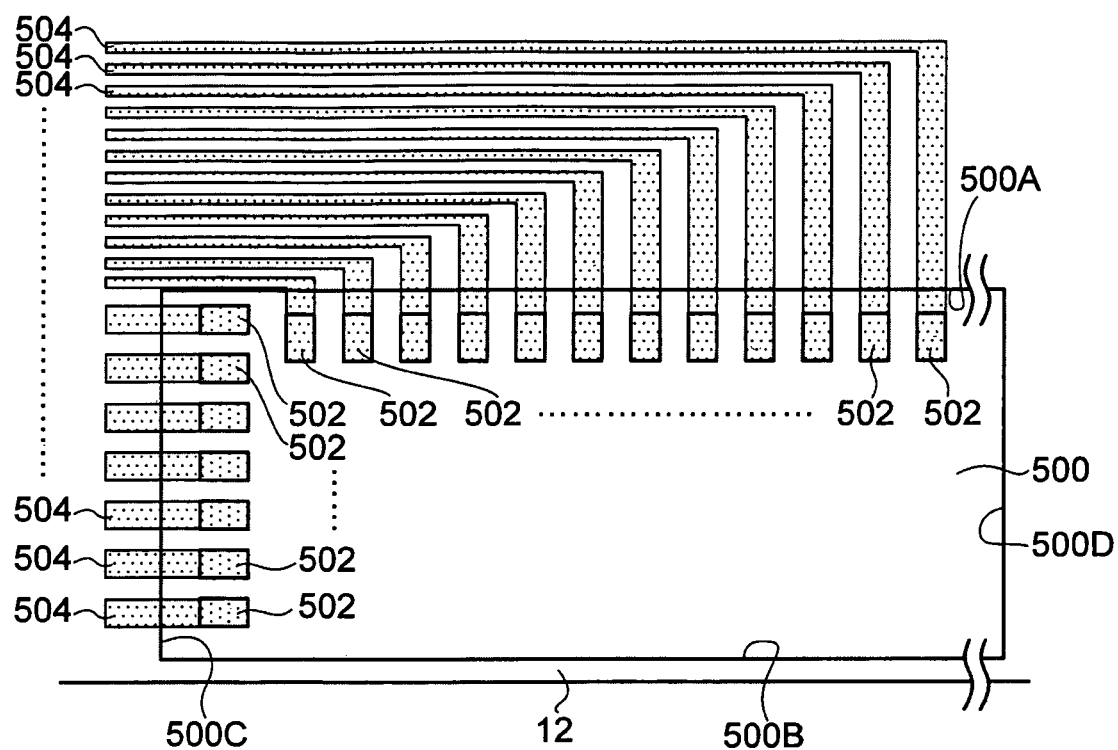
FIG. 6 is a partially enlarged view of a conventional driver IC.

Next, explanation will be made on a configuration of a comparative example. The comparative example used herein illustrates the configuration of a conventional driver IC. FIG. 6 is a partially enlarged view of a driver IC in the comparative example. In a driver IC 500 of the comparative example (hereinafter referred to as a comparative driver IC 500), input terminals 502 are disposed at intervals along the first short side 500C of the comparative driver IC 500. In the case where the number of input terminals 502 is large such that the input terminals 502 cannot be disposed along the first short side 500C, the input terminals 502 are disposed at intervals along a long side 500A on the side of a display section 14 in the comparative driver IC 500. In this case, the number of the input terminals 502 that can be disposed along the first short side 500C of the comparative driver IC 500 depends upon, not the intervals between wirings 504 connected to each of the input terminals 502, but the intervals between the input terminals 502 or the width of the input terminal 502. Further, when the number of the input terminals 502 that cannot be disposed along the first short side 500C increases, length of the long side 500A, in which the input terminals 502 are disposed, increases. Accordingly, the area of the comparative driver IC 500 increases.

On the other hand, according to the exemplary embodiment of the invention, the first wiring group 300, having intervals or width that are smaller than the intervals or the width of the input terminals of the first input terminal group 204, is disposed along the short side 18C of the driver IC 18. Due thereto, according to the number of wires of the first wiring group 300 that can be disposed along the first short side 18C of the driver IC 18, input terminals of the first input terminal group 204 can be disposed along the first long side 18B of the driver IC 18.

Accordingly, in comparison with the comparative driver IC 500, in which the input terminals 502 are disposed along the first short side 500C of the comparative driver IC 500, the input terminals 202 are disposed along the first long side 18B of the driver IC 18, so that the number of input terminals 202 that can be disposed increases. Therefore, the present invention may suppress the increase in area of the driver IC 18 due to increased number of input terminals 202.

Namely, in the exemplary embodiment of the present invention, since the first input terminal group 204 and the second input terminal group 206 are disposed along the long sides 18A and 18B of the driver IC 18 respectively, the area of the driver IC 18 also increases due to the increased number of input terminals 202. However, in the comparative example, when the number the input terminals 502 (i.e., the input terminals 502 disposed along the long side 500A of the driver IC 500) exceeds the number of input terminals 502 that can be disposed along the short side 500C (namely, when the entire number exceeds 14 in FIG. 6), the present invention may suppress the increase in area of the driver IC 18 due to increased number of input terminals 202, by the reduced amount of the intervals between the wirings or the width of the wiring of the first wiring group 300.

Figure 5:
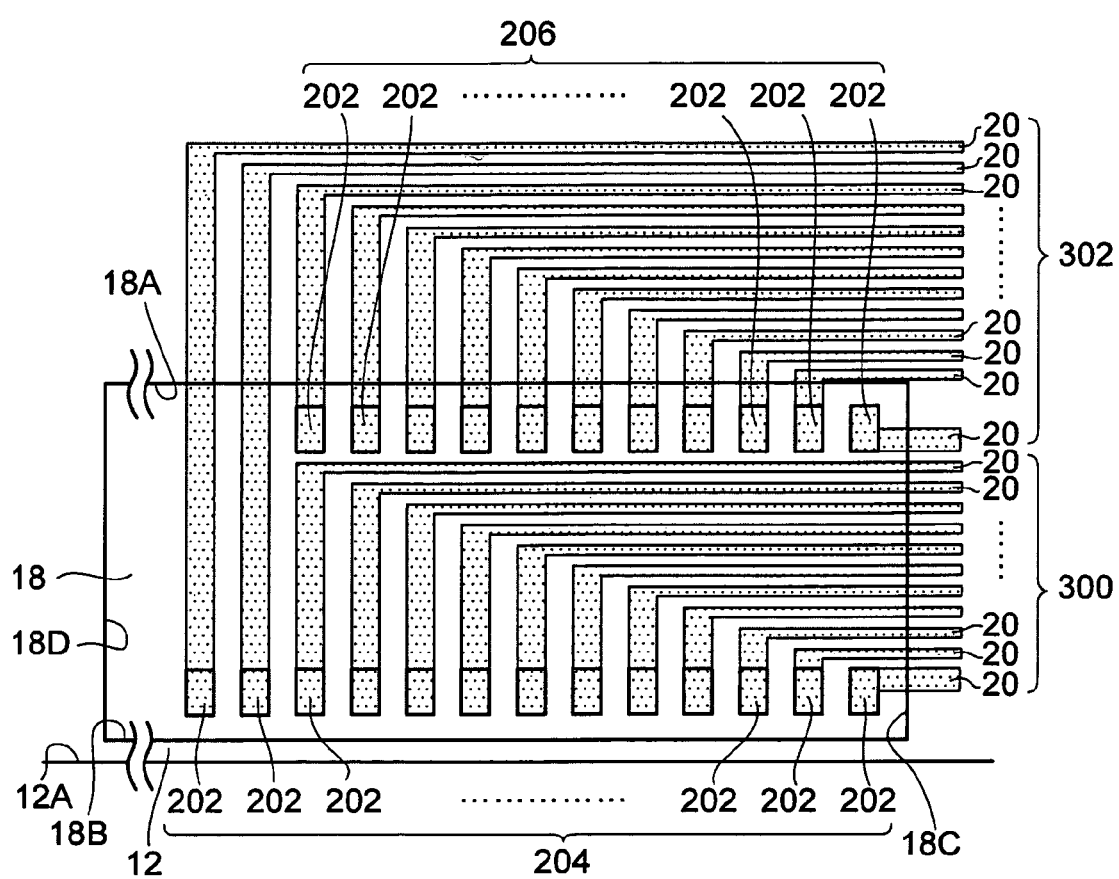
FIG. 5 is a view illustrating the driver IC shown in FIG. 4, turned at 180°.

Further, according to the exemplary embodiment, even when the driver IC 18 shown in FIG. 4 is turned at 180°, the wirings can be fixedly wired in the panel body 12, as shown in FIG. 5. Therefore, both of right and left alignments can be coped with (FIG. 4 and FIG. 5) even when no wiring can be wired between the driver IC 18 and the panel end portion 12A.

The present invention is not limited to the above exemplary embodiment, and various modifications, alterations, and improvements can be implemented.

For example, a case where the wirings connected to the first input terminal group 204 and the second input terminal group 206 are the transparent electrodes has been described, the wirings may not be transparent. In addition, materials of the electrodes are not particularly limited, as long as they are conductive.

Moreover, in FIG. 4, a case where the first wiring group 300 extends from the first input terminal group 204 toward the second input terminal group 206, extends toward the first short side 18C of the driver IC 18 on the way toward the second input terminal group 206, and extends out from the short side 18C to the panel body 12, has been described. However, as long as the first wiring group 300 is extended from the short side 18C to the panel body 12, its arrangement or shape under below the driver IC 18 may take any aspects. For example, the first wiring group 300 may extend from the first input terminal group 204 toward the short side 18C with a curve.

Further, as shown in FIG. 5, in a case where the number of input terminals 202 formed downside becomes larger than the number of input terminals 202 formed upside, a configuration in which the wirings extending from input terminals 202 by the number of excessive input terminals leftward are extended from upside can be applied to the case where wiring are extended from leftward, as shown in FIG. 4.

Note that, although the input terminals 202 are disposed with the equal intervals in FIG. 4, it is preferable to form input terminals with separate intervals rather than equal intervals in consideration of a crosstalk with an adjacent terminal.

What is claimed is:

1. A display panel comprising:
a panel body of a rectangular shape including a display section;
a rectangular driver IC, provided within a region between the display section and a panel end portion of the panel body and disposed with the display section in a longitudinal direction, which drives the display section;
a first input terminal group in which input terminals are disposed at intervals along a first long side of the rectangular driver IC that faces the panel end portion, and to which input signals are input from outside of the display panel;
a second input terminal group in which input terminals are disposed at intervals along a second long side of the rectangular driver IC that faces the display section, and to which input signals are input from outside of the display panel;
a first wiring group that is connected at one end to the first input terminal group, that is formed on the panel body between the rectangular driver IC and the panel body, that includes a portion of first wiring passing under a first short side of the rectangular driver IC and that extends out from between the rectangular driver IC and the panel body to connect at another end to a CPU; and
a second wiring group that is connected at one end to the second input terminal group, that is formed on the panel body between the rectangular driver IC and the panel body, that passes under the second long side of the rectangular driver IC and that extends out from between the rectangular driver IC and the panel body to connect at another end to the CPU.

2. A display panel comprising:
a panel body of a rectangular shape including a display section;
a rectangular driver IC, provided within a region between the display section and a panel end portion of the panel body and disposed with the display section in a longitudinal direction, which drives the display section;

a first input terminal group in which input terminals are disposed at intervals along a first long side of the rectangular driver IC that faces the panel end portion, and to which input signals are input from outside of the display panel;

a second input terminal group in which input terminals are disposed at intervals along a second long side of the rectangular driver IC that faces the display section, and to which input signals are input from outside of the display panel;

a first wiring group that is connected to the first input terminal group, that is formed on the panel body between the rectangular driver IC and the panel body, that includes a portion of first wiring passing under a first short side of the rectangular driver IC and that extends out from between the rectangular driver IC and the panel body; and a second wiring group that is connected to the second input terminal group, that is formed on the panel body between the rectangular driver IC and the panel body, that passes under the second long side of the rectangular driver IC and that extends out from between the rectangular driver IC and the panel body;

wherein:

the first input terminal group and the second input terminal group are sequentially disposed from an end portion of the first short side of the rectangular driver IC; and wirings of the first wiring group that are connected to the input terminals of the first input terminal group and that are disposed further toward a second short side of the rectangular driver IC than the second input terminal group, extend out from under the second long side of the rectangular driver IC.

3. The display panel of claim 1, wherein a width of wirings of the first wiring group that extend out from under the first short side of the rectangular driver IC is smaller than a width of the input terminals of the first input terminal group and the second input terminal group.

4. The display panel of claim 1, wherein intervals between wirings of the first wiring group and intervals between wirings of the second wiring group are smaller than the intervals between the input terminals of the first input terminal group and the intervals between the input terminals of the second input terminal group.

5. The display panel of claim 1, wherein a number of input terminals disposed along both of the long sides of the rectangular driver IC is larger than a number of input terminals that can be disposed at either short side of the rectangular driver IC.

6. The display panel of claim 1, wherein:

the first wiring group extends from the first input terminal group toward the second input terminal group, then extends toward the first short side of the rectangular driver IC before reaching the second input terminal group, and extends under the first short side of the rectangular driver IC; and the second wiring group extends from the second input terminal group toward the second long side of the rectangular driver IC, and extends under the second long side of the rectangular driver IC.

7. The display panel of claim 1, wherein:

the rectangular driver IC includes a CPU interface and a driving circuit; and the first input terminal group and the second input terminal group are groups of input terminals for the CPU interface and the power source circuit.

8. The display panel of claim 1, wherein the wirings of the first wiring group and the second wiring group are transparent electrodes.

9. A display panel comprising:

a panel body of a rectangular shape including a display section;

a rectangular driver IC, provided between the display section and a panel end portion of the panel body and disposed with the display section in a longitudinal direction, which drives the display section;

a first input terminal group in which input terminals are disposed at intervals along a first long side of the rectangular driver IC that faces the panel end portion, and to which input signals are input from outside of the display panel;

a first wiring group that is connected at one end to the first input terminal group, that is formed on the panel body between the rectangular driver IC and the panel body, that passes under a first short side of the rectangular driver IC and that extends out from between the rectangular driver IC and the panel body to connect at another end to a CPU; and a second wiring group that is connected at one end to a second input terminal group, that is formed on the panel body between the rectangular driver IC and the panel body, that passes under a second long side of the rectangular driver IC and that extends out from between the rectangular driver IC and the panel body to connect at another end to the CPU, wherein at least no conductive member is provided between the end portion of the panel end side of the rectangular driver IC and the panel end.

10. The display panel of claim 9, further comprising an output terminal group in which output terminals are disposed at intervals along a second long side of the rectangular driver IC that faces the display section, wherein each output terminal of the output terminal group is electrically connected with the display section.

11. The display panel of claim 9, further comprising a flexible board that supplies power source and signals that are input to the first input terminals, wherein the flexible board is connected to the panel body at a region except a region that faces the long side of the rectangular driver IC.

12. The display panel of claim 9, wherein the first input terminals of the first input terminal group are disposed in line along the longitudinal direction of the rectangular driver IC from an end portion of the first short side of the rectangular driver IC.

13. The display panel of claim 12, further comprising:

a second input terminal group in which input terminals are disposed at intervals along a second long side of the rectangular driver IC that faces the display section and are disposed in line along the first long side of the rectangular driver IC from an end portion of the first short side of the rectangular driver IC; and a second wiring group that is connected to the second input terminal group.

14. A display panel comprising:

a panel body including a display section;

a rectangular driver IC, provided on the panel body between the display section and a panel end portion of the panel body and disposed with the display section in a longitudinal direction, which drives the display section;

a first input terminal group in which input terminals are disposed at intervals along a first long side of the rectangular driver IC that faces the panel end portion, and to which input signals are input from outside of the display panel;

a first wiring group that is connected at one end to the first input terminal group, that is formed on the panel body between the rectangular driver IC and the panel body, that passes under a first short side of the rectangular driver terminals at that extends out from between the rectangular driver IC and the panel body to connect at another end to a CPU;

a second wiring group that is connected at one end to a second input terminal group, that is formed on the panel body between the rectangular driver IC and the panel body, that passes under a second long side of the rectangular driver IC and that extends out from between the rectangular driver IC and the panel body to connect at another end to the CPU; and a flexible board connected to the panel body that supplies power source and signals that are input to the first input terminals wherein the flexible board is connected to the panel body at a region except a region that faces the long side of the rectangular driver IC.

15. The display panel of claim 14, wherein the first input terminals of the first input terminal group are disposed in line along the longitudinal direction of the rectangular driver IC from an end portion of the first short side of the rectangular driver IC.

16. The display panel of claim 15, further comprising:

a second input terminal group in which input terminals are disposed at intervals along a second long side of the rectangular driver IC that faces the display section and are disposed in line along the first long side of the rectangular driver IC from an end portion of the first short side of the rectangular driver IC; and a second wiring group that is connected to the second input terminal group.

17. The display panel of claim 16, wherein:

the first wiring group extends from the first input terminal group toward the second input terminal group, then extends toward the first short side of the rectangular driver IC before reaching the second input terminal group, and extends under the first short side of the rectangular driver IC; and the second wiring group extends from the second input terminal group toward the second long side of the rectangular driver IC, and extends under the second long side of the rectangular driver IC.

18. The display panel of claim 1, wherein the second wiring group is disposed along the second long side of the rectangular driver IC and the longitudinal direction of the display section, and is connected to the outside of the display panel.

19. The display panel of claim 1, further comprising output terminals that are disposed at intervals along a second long side of the rectangular driver IC, that face the display section, and that output signals to the display section.

20. The display panel of claim 19, further comprising a third wiring group in which one end of each of wirings is respectively connected to one of the output terminals and other ends are connected to the longitudinal direction and a header direction of the display section.

* * * * *